(12) United States Patent
Slechta

(10) Patent No.: US 9,823,149 B2
(45) Date of Patent: Nov. 21, 2017

(54) SLEW RATE DETECTION CIRCUIT

(71) Applicant: Invensys Systems, Inc., Foxboro, MA (US)

(72) Inventor: William M. Slechta, North Attleboro, MA (US)

(73) Assignee: Schneider Electric Systems USA, Inc., Foxboro, MA (US)

(*) Notice: Subject to any disclaimer, the term of this patent is extended or adjusted under 35 U.S.C. 154(b) by 113 days.

(21) Appl. No.: 15/016,405

(22) Filed: Feb. 5, 2016

(65) Prior Publication Data

US 2016/0153855 A1 Jun. 2, 2016

Related U.S. Application Data

(63) Continuation of application No. 14/150,416, filed on Jan. 8, 2014, now Pat. No. 9,285,286.

(51) Int. Cl.
| | |
|---|---|
| *G05B 23/02* | (2006.01) |
| *G01L 9/00* | (2006.01) |
| *G05D 1/08* | (2006.01) |
| *G01K 5/46* | (2006.01) |
| *H03K 19/003* | (2006.01) |
| *G01L 13/02* | (2006.01) |

(52) U.S. Cl.
CPC ............. *G01L 9/0041* (2013.01); *G01K 5/46* (2013.01); *G05B 23/0235* (2013.01); *G05D 1/0883* (2013.01); *G01L 13/025* (2013.01); *H03K 19/00361* (2013.01)

(58) Field of Classification Search
CPC . G01L 13/025; G01L 9/0022; G01L 19/0645; G01L 9/0041; G01K 5/46; G05B 23/0235; G05D 1/0883
USPC .................... 73/717, 715, 700; 327/170, 516
See application file for complete search history.

(56) References Cited

U.S. PATENT DOCUMENTS

| | | | | |
|---|---|---|---|---|
| 4,589,077 A * | 5/1986 | Pope | ..................... | G01F 23/263 361/284 |
| 5,600,528 A * | 2/1997 | McQueen | ............. | G01F 23/246 361/103 |
| 6,225,844 B1 * | 5/2001 | Fujiwara | .......... | H03K 19/00361 327/108 |
| 7,893,751 B2 * | 2/2011 | Deml | ................. | H03K 17/0822 327/170 |
| 2005/0253635 A1 * | 11/2005 | Hargan | .................... | H03K 5/12 327/170 |

\* cited by examiner

*Primary Examiner* — Lisa Caputo
*Assistant Examiner* — Nathaniel T Woodward
(74) *Attorney, Agent, or Firm* — Stephen Manetta; Ralph Graham

(57) ABSTRACT

A slew rate detection circuit connected to a sensor detects when an analog electrical signal from the sensor indicates a slew rate that exceeds a threshold value, and generates an interrupt electrical signal when the slew rate is detected as exceeding the threshold value. A control circuit determines a measurement value of the physical property in response to receiving the interrupt signal. The control circuit is connected to an A/D converter, which converts the analog electrical signal into a digital electrical signal, and performs a plurality of sensing system operations including determining the measurement value of the physical property as a function of the digital electrical signal.

18 Claims, 3 Drawing Sheets

SLEW RATE DETECTION CIRCUIT

CROSS REFERENCE TO RELATED APPLICATION

This application is a continuation of commonly owned U.S. patent application Ser. No. 14/150,416, filed Jan. 8, 2014, the entire disclosure of which is incorporated herein by reference.

BACKGROUND

A sensing system includes a collection of mechanical and electrical components used to detect or measure a physical property and to indicate the detected or measured physical property. The mechanical components require an amount of time to respond to changes in the physical property and processing components. Additionally, one or more of the electrical components may intentionally slow the sensing time for the sensing system to reduce noise that would have otherwise been present when the sensing system is sampled under stable process conditions. Further, the sensing system may include conversion and processing components that are responsible for multiple tasks and the order of completing the tasks can add delay to a providing a final and accurate measurement value.

SUMMARY

Aspects of the present invention relate to a sensing system that provides a fast response to process step. In one embodiment, the sensing system is able to respond to the process step within 100 milliseconds. In particular, aspects of the invention minimize delay while the sensing system clews to the final value after the step.

In one aspect, the sensing system comprises a sensor for generating an analog electrical signal over a period of time in response to a step change in a physical property. The sensor comprises at least one mechanical component and at least one electrical component in communication with the mechanical component. The mechanical component is configured to generate a response to the step change in the physical property. The electrical component is configured to generate the analog electrical signal indicative of the response generated by the mechanical component. An analog to digital (A/D) converter is connected to the electrical component for converting the analog electrical signal into a digital electrical signal. A control circuit is connected to the A/D converter in order to receive the digital electrical signal and perform a plurality of sensing system operations including determining a measurement value of the physical property as a function of the received digital electrical signal.

A slew rate detection circuit is connected to the at least one electrical component for receiving the analog electrical signal produced by the electrical component. The slew rate detection circuit is configured to detect when the analog electrical signal indicates a slew rate that exceeds a threshold value. For example, the slew rate detection circuit is configured to detect that the analog electrical signal indicates a slew rate that exceeds a threshold value when a step change of the physical property occurs. The slew rate detection circuit is configured to generate an interrupt electrical signal when the slew rate is detected as exceeding the threshold value.

The control circuit is connected to the slew rate detection circuit for receiving the interrupt electrical signal from the slew rate detection circuit. In response to receiving the interrupt electrical signal, the control circuit is configured to determine a measurement of the physical property rather than performing any of the other sensing system operations. In one embodiment, upon receiving the interrupt electrical signal the control circuit is further configured to provide instructions to the A/D converter to convert the analog electrical signal received from the electrical component rather than converting any other analog electrical signals that may be received by the A/D converter.

Other objects and features will be in part apparent and in part pointed out hereinafter.

BRIEF DESCRIPTION OF THE DRAWINGS

Corresponding reference characters indicate corresponding parts throughout the drawings.

DETAILED DESCRIPTION

Figure 1:
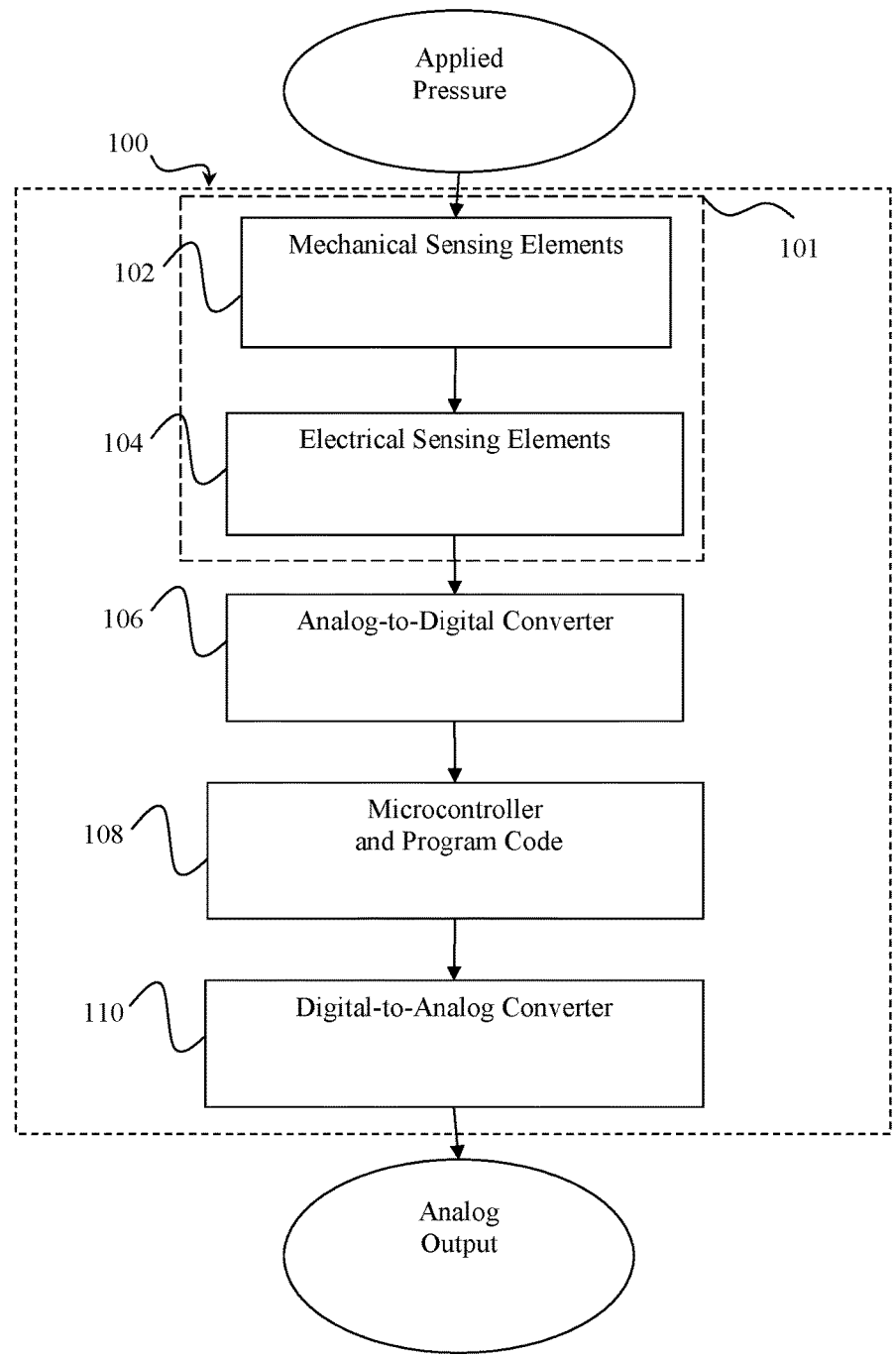
FIG. 1 is a partial block, partial flow diagram of a sensing system in accordance with an embodiment of the invention.

FIG. 1 illustrates the components of an exemplary sensing system 100 in accordance with an embodiment of the invention. The illustrated sensing system 100 is a pressure transmitter (e.g., differential pressure transmitter) but it should be noted that the sensing system 100 could be any other type of sensing system (e.g., temperature sensor, density meter, etc.) and the below teachings correspond to sensing the other types of physical properties (e.g., temperature, density, etc.).

The sensing system 100 includes a sensor 101 (e.g., pressure sensor) for generating an analog electrical signal representing a sensed pressure. The sensor 101 includes mechanical sensing elements 102 and electrical sensing elements 104 that are in communication with each other. The mechanical sensing elements 102 are configured to generate a response to applied pressure, and the electrical sensing elements 104 are configured to generate the analog electrical signal that is indicative of the response generated by the mechanical sensing elements 102. In one embodiment, the mechanical sensing elements 102 include a metal diaphragm and a fluid filled chamber operatively connected together. The metal diaphragm flexes away from a resting point in response to applied pressure, transferring pressure to the fluid filled chamber. The electrical sensing elements 104, which may include filtering elements, are connected to the fluid filled chamber for generating an analog electrical signal that is proportional to the applied pressure.

An analog to digital (A/D) converter 106 is connected to the electrical sensing elements 104. The A/D converter 106 receives the analog electrical signal and converts it to a digital electrical signal. In particular, A/D converter 106 converts the analog electrical signal that is generated over a period of time into discrete digital values as a function of time. In one embodiment, the A/D converter 106 samples the analog electrical signal output by the sensor 101 and converts each sample into a digital value. The digital electrical signal accordingly comprises a set of sequential digital values.

A control circuit is connected to the A/D converter 106 for receiving the digital values from the A/D converter 106. In the illustrated sensing system 100, the control circuit includes a microcontroller and program code 108, but it should be noted that alternative or additional circuitry may be used without departing from the scope of the invention. The control circuit is configured to apply one or more algorithms to the received digital values to produce a measurement value that represents the applied pressure. The illustrated sensing system 100 also includes a digital to analog (D/A) converter 110 connected to the microcontroller and program code 108. The D/A converter 110 receives the digital measurement values from the microcontroller 108 and converts them to an analog output signal that represents the applied pressure.

In one embodiment, the control circuit (e.g., microcontroller and program code 108) performs a plurality of sensing system operations. In addition to determining a measurement value that represents the applied pressure, the control circuit may be configured to periodically update a display panel included in the sensing system 100 with the most recent determined measurement value, and to ensure that critical values stored in memory remain uncorrupted in the memory. The sensing system 100 may be further configured for communicating with an external device, such as a computing device. In this case, another operation performed by the control circuit is responding to digital messages received from the external device. The plurality of sensing system operations are generally not all ready for performing simultaneously. For example, the display may only need to be updated twice per second, and the determination of a measurement value is only performed in response to receiving a digital value from the A/D converter 106. Likewise, the control circuit only needs to respond to digital messages from the external device when it receives a message from the external device.

In one embodiment, the control circuit utilizes multitasking techniques to divide up the work required by the control circuit to perform the plurality of operations. The control circuit is configured to divide processing time into segments. At the beginning of each segment of time, the control circuit identifies which operation that is ready to run has the highest priority (e.g., importance), and it performs the identified operation. An interrupt signal is a signal used to indicate an event has occurred so that the operation may be ready to run. In one embodiment, the A/D converter 106 generates an interrupt signal when new conversion data is available. The sensing system 100 may also include a timer that generates an interrupt when a time period between display updates has elapsed indicating that the update display operation is ready to perform. An interrupt signal may likewise be generated when a communications message is received from an external device.

Figure 2:
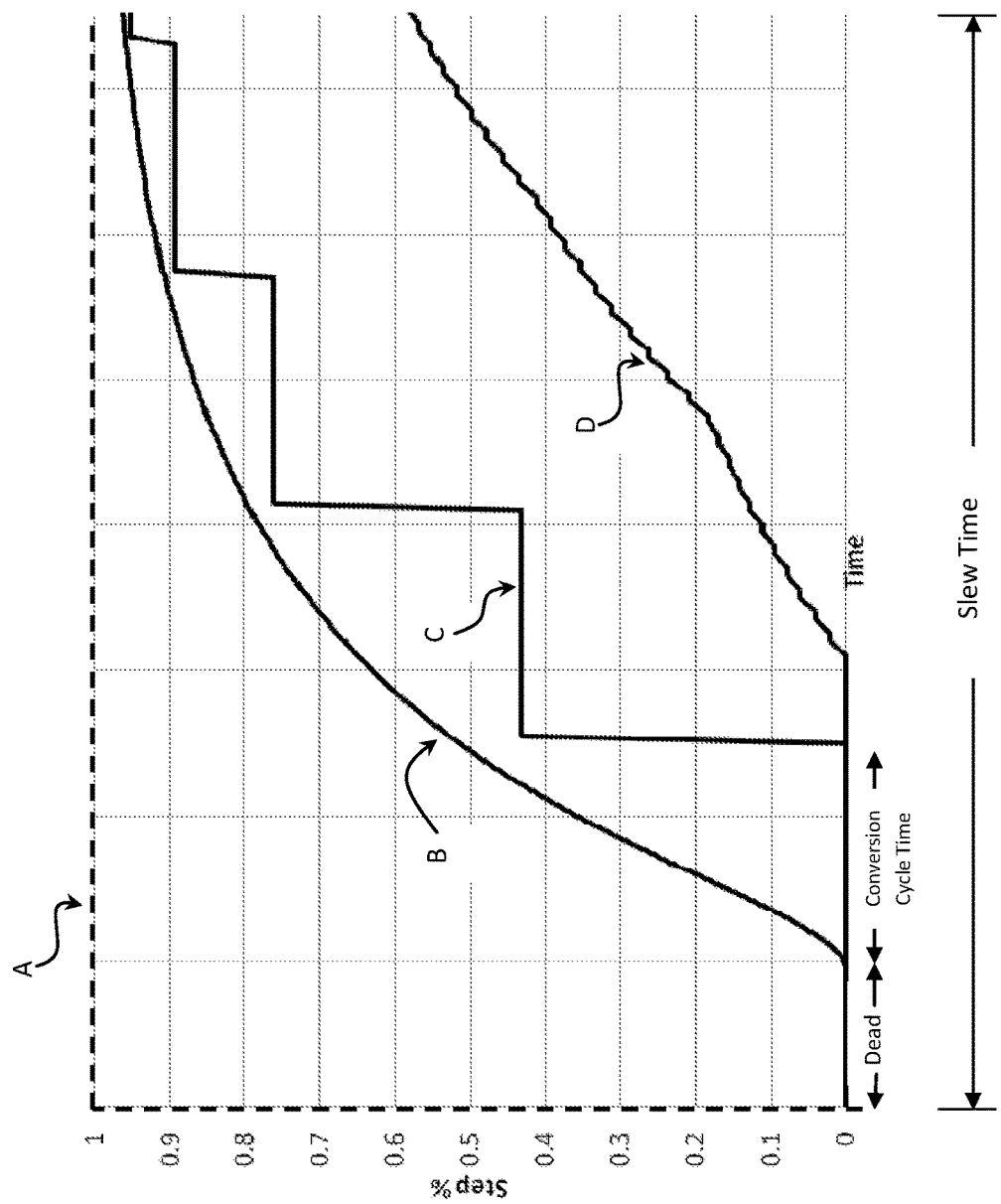
FIG. 2 is a timing diagram of an exemplary sensing system in accordance with an embodiment of the invention.

Referring to FIG. 2, in general, there is a delay between the time at which a step occurs in the applied pressure and the time at which the step is represented in the analog output signal from the D/A converter 110. FIG. 2 is a graph illustrating examples of the various delays that occur within the sensing system 100. In the illustrated embodiment, Signal A represents the applied pressure, and illustrates a pressure step that occurs at time 0. Signal B represents the analog electrical signal that is generated by the electrical sensing elements 104. Signal C represents the digital values generated by the A/D converter 106. Signal D represents the analog output signal that is produced by the D/A converter 110.

The amount of time that is required for the entire process input step (e.g., pressure step) to be represented by the analog electrical signal (i.e., signal B) that is provided to the A/D converter 106 is referred to as the slew time. The slew time may be due to, for example, time needed for fluid within the fluid chamber to move such that the pressure change is communicated to the electrical sensing elements 104. The delay between the pressure step (i.e., signal A) and any indication of a pressure change in the analog electrical signal (i.e., signal B) provided to the A/D converter 106 is referred to as dead time. The delay between the appearance of a slewing signal at the A/D converter 106 and the time the control circuit is able to detect an input signal change is referred to as the conversion cycle time.

Aspects of the present invention provide a reduction in the conversion cycle time in order to optimize the step response time of the sensing system 100. In one embodiment, the sensing system 100 includes a slew rate detection circuit. The slew rate detection circuit is connected to the electrical sensing elements 104 and to the control circuit. The slew rate detection circuit is configured to detect when the analog electrical signal indicates a slew rate that exceeds a threshold value, and to generate an interrupt electrical signal when the slew rate is detected as exceeding a threshold value. The control circuit receives the interrupt electrical signal and, in response thereto, identifies the occurrence of a pressure step and promptly determines the pressure measurement.

Figure 3:
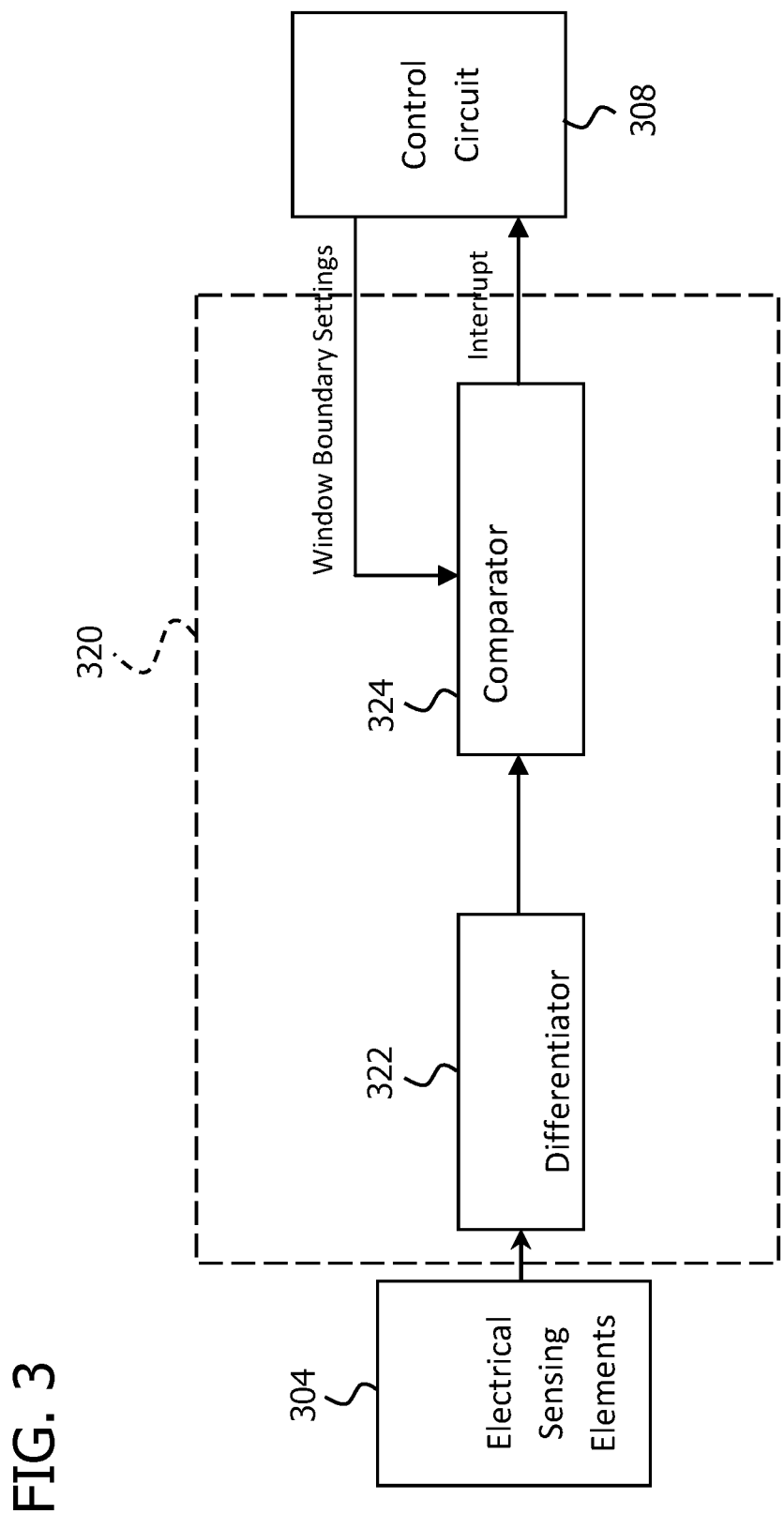
FIG. 3 is a block diagram of an exemplary slew rate detection circuit in accordance with an embodiment of the invention.

An exemplary slew rate detection circuit 320 is illustrated in FIG. 3. The exemplary slew rate detection circuit 320 includes a differentiator 322 and a comparator 324. The slew rate detection circuit 320 is connected to electrical sensing elements 304 for receiving an analog voltage signal therefrom. The analog voltage signal represents the pressure sensed by the mechanical sensing elements 102 (not shown in FIG. 3). In particular, the differentiator 322 receives the analog voltage signal and determines the rate of change of the sensed pressure from the analog voltage signal and produces a differential signal representing the determined rate of change of the sensed pressure. In one embodiment, the differentiator 322 determines the difference between a current value of the analog voltage signal and the value of the analog voltage signal just prior to the current value in order to determine the rate of change of the sensed pressure. The magnitude of the differential signal is proportional to the difference between the subsequent voltage values of the analog voltage signal.

The differentiator 322 is connected to the comparator 324. The comparator 324 receives the differential signal and compares it to a threshold value(s) to determine whether the differential signal exceeds boundaries (e.g., window settings) represented by the threshold value(s). Thus, the comparator 324 determines whether the rate of change of the sensed pressure is increasing (e.g., differential signal has a positive polarity) or decreasing (e.g., differential signal has a negative polarity) faster than the threshold values. In one embodiment, the threshold value(s) may be pre-defined, static values. In the illustrated embodiment, the comparator 324 is connected to a control circuit 308, such as described above with reference to FIG. 1, for receiving the threshold value(s) therefrom. Thus, the threshold value(s) are dynamic, programmable values. The threshold value(s) may be configured by the control circuit as a function of pre-defined conditions. The threshold value(s) may be asymmetrical (e.g., the threshold value for a rising differential signal is greater than the threshold value for a falling differential signal) or symmetrical. If the comparator 324 determines that the differential signal exceeds a boundary represented by a threshold value, the comparator 324 generates an interrupt signal that is provided the control circuit. In response to receiving the interrupt signal from the comparator 324, the control circuit 308 identifies that process step has occurred and thus the conversion cycle time is nearly eliminated.

In one embodiment, the A/D converter 106 is configured to receive one or more analog electrical signals in addition to the analog electrical signal generated the sensor 101 (referred to hereinafter as "primary analog sensor signal"). The sensing system 100 may include additional sensors which provide analog electrical signals representative of a sensed value to the A/D converter 106. For example, the additional sensors may provide analog electrical signals representative of a temperature of the sensor 100 or portions thereof (e.g., electronic components). These additional analog electrical signals may be used to adjust the value represented by the primary analog sensor signal in determining the final pressure measurement. In addition, the A/D converter 106 may receive analog reference signals (e.g., reference voltages) or analog drive signals (e.g., voltage signal used to drive the sensor 100 or an additional sensor). The A/D converter 106 converts one analog signal at a time. Thus, the A/D converter 106 is configured to convert each of the plurality of analog electrical signals that it receives in a particular succession. In other words, the A/D converter 106 alternately converts the received analog electrical signals into digital electrical signals.

In one embodiment, when the slew rate detection circuit detects that the slew rate exceeds a threshold value (e.g., a step has occurred), the A/D converter is configured to suspend (e.g., abort) its current signal conversion and convert the primary analog sensor signal. In one embodiment, when the control circuit, such as control circuit 308, receives the interrupt signal from the slew rate detection circuit 320 indicating that a pressure step has occurred, the control circuit configures the A/D converter 106 to convert the primary analog sensor signal rather than converting any other signal. In particular, if the A/D converter 106 is currently converting the primary analog sensor signal when the control circuit receives the interrupt signal from the slew rate detection circuit 320, the control circuit allows the A/D converter to continue the current conversion. On the other hand, if the A/D converter 106 is currently converting an analog signal other than the primary analog sensor signal when the control circuit receives the interrupt signal from the slew rate detection circuit 320, the control circuit configures the A/D converter to abort the current conversion and begin converting the primary analog sensor signal. By promptly converting the primary analog sensor signal, the sensing system 100 eliminates the delay that would result if the A/D converter 106 cycled through the conversions of the plurality of received analog electrical signals in, for example, the standard order.

When introducing elements of the present invention or the preferred embodiments(s) thereof, the articles "a", "an", "the" and "said" are intended to mean that there are one or more of the elements. The terms "comprising", "including" and "having" are intended to be inclusive and mean that there may be additional elements other than the listed elements.

In view of the above, it will be seen that the several objects of the invention are achieved and other advantageous results attained.

Having described aspects of the invention in detail, it will be apparent that modifications and variations are possible without departing from the scope of aspects of the invention as defined in the appended claims. As various changes could be made in the above constructions, products, and methods without departing from the scope of the invention, it is intended that all matter contained in the above description and shown in the accompanying drawings shall be interpreted as illustrative and not in a limiting sense.

What is claimed is:
1. A method comprising:
receiving an analog electrical signal produced by a sensor, said analog electrical signal representing a response to a physical property produced by the sensor;
detecting, with a slew rate detection circuit, when the analog electrical signal indicates a slew rate that exceeds a threshold value;
generating an interrupt electrical signal when the slew rate is detected as exceeding the threshold value, said interrupt electrical signal indicating an occurrence of a step change in the physical property; and
providing the interrupt electrical signal to a control circuit connected to the slew rate detection circuit, wherein the control circuit is responsive to the interrupt signal indicating the slew rate exceeded the threshold value for interrupting a current operation of the control circuit and determining a measurement value of the physical property.

2. The method of claim 1, wherein the sensor comprises a pressure sensor, and the physical property is applied pressure.

3. The method of claim 2, further comprising detecting when the analog electrical signal indicates a pressure step, said pressure step indicating that the slew rate exceeds the threshold value.

4. The method of claim 1, further comprising:
receiving the analog electrical signal and determining a difference between successive values thereof;
generating a differential signal having a magnitude proportional to the determined difference; and
comparing the magnitude of the differential signal to the threshold value.

5. The method of claim 1, further comprising:
detecting when the analog electrical signal indicates the slew rate exceeds a first threshold value when the analog electrical signal is rising; and
detecting when the analog signal indicates the slew rate exceeds a second threshold value when the analog signal is falling.

6. The method of claim 1, wherein the sensor comprises a temperature sensor, and the physical property is temperature.

7. A method comprising:
alternately converting, by an analog-to-digital (A/D) converter, between a first analog electrical signal from a first sensor into a first digital electrical signal and a second analog electrical signal from a second sensor into a second digital electrical signal, wherein the first analog electrical signal represents a first sensed physical property, and wherein the second analog electrical signal represents a second sensed physical property;
receiving, by a control circuit connected to the A/D converter, the first digital electrical signal and the second digital electrical signal;
determining, by the control circuit, a measurement value of the first sensed physical property as a function of the received first digital electrical signal;
generating, by the control circuit, an output electrical signal indicative of the determined measurement value;
receiving, by a slew rate detection circuit connected to the control circuit, the first analog electrical signal;

detecting, by the slew rate detection circuit, when the first analog electrical signal indicates a slew rate that exceeds a threshold value; and converting, by the A/D converter, the first analog electrical signal into the first digital electrical signal rather than converting the second analog electrical signal into the second digital electrical signal in response to the slew rate detection circuit detecting that the first analog electrical signal indicates the slew rate exceeds the threshold value.

8. The method of claim 7, wherein the first sensor is a pressure sensor, and the physical property is applied pressure.

9. The method of claim 7, wherein the second sensor is a temperature sensor, and the physical property is temperature.

10. The method of claim 7, further comprising generating, by the slew rate detection circuit, an interrupt signal in response to detecting, by the slew rate detection circuit, that the first analog electrical signal indicates the slew rate exceeds the threshold value.

11. The method of claim 10, further comprising converting, by the A/D converter, the first analog electrical signal into the first digital electrical signal rather than converting the second analog electrical signal into the second digital electrical signal in response to the control circuit receiving the interrupt signal.

12. The method of claim 7, further comprising detecting, by the slew rate detection circuit, when the first analog electrical signal indicates a pressure step, said pressure step indicating that the slew rate exceeds the threshold value.

13. The method of claim 7, further comprising:
receiving, by the slew rate detection circuit, the first analog electrical signal and determining a difference between successive values thereof;
generating, by the slew rate detection circuit, a differential signal having a magnitude proportional to the determined difference; and comparing, by the slew rate detection circuit, the magnitude of the differential signal to the threshold value.

14. The method of claim 7, further comprising:
detecting, by the slew rate detection circuit, when the first analog electrical signal indicates the slew rate exceeds a first threshold value when the analog electrical signal is rising; and
detecting, by the slew rate detection circuit, when the analog signal indicates the slew rate exceeds a second threshold value when the analog signal is falling.

15. A method comprising:
converting a sensed pressure signal into a digital sensed pressure signal, wherein the sensed pressure signal is an analog electrical signal representative of an applied pressure;
determining a measurement value of the applied pressure as a function of the digital sensed pressure signal;
detecting an occurrence of a pressure step when the sensed pressure signal indicates a slew rate that exceeds a threshold value;
suspending a current converting of the sensed pressure signal into the digital sensed pressure signal in response to the occurrence of the pressure step and newly converting the sensed pressure signal into the digital sensed pressure signal.

16. The method of claim 15, further comprising:
receiving the sensed pressure signal and determining a difference between successive values thereof;
generating a differential signal having a magnitude proportional to the determined difference; and
comparing the magnitude of the differential signal to the threshold value.

17. The method of claim 15, further comprising generating an interrupt signal in response to detecting the occurrence of the pressure step.

18. The method of claim 17, further comprising determining a measurement value of the applied pressure rather than performing other sensing system operations in response to the interrupt signal.

\* \* \* \* \*